(12) United States Patent
Takaishi et al.

(10) Patent No.: US 12,311,496 B2
(45) Date of Patent: May 27, 2025

(54) METHOD OF DOUBLE-SIDE POLISHING WORK, METHOD OF PRODUCING WORK, AND DOUBLE-SIDE POLISHING APPARATUS FOR A WORK

(71) Applicant: SUMCO CORPORATION, Tokyo (JP)

(72) Inventors: Kazushige Takaishi, Saga (JP); Chin Fu Tsai, Yunlin Hsien (TW)

(73) Assignee: SUMCO CORPORATION, Tokyo (JP)

( * ) Notice: Subject to any disclaimer, the term of this patent is extended or adjusted under 35 U.S.C. 154(b) by 318 days.

(21) Appl. No.: 18/001,416

(22) PCT Filed: Feb. 5, 2021

(86) PCT No.: PCT/JP2021/004304
§ 371 (c)(1),
(2) Date: Dec. 9, 2022

(87) PCT Pub. No.: WO2021/250937
PCT Pub. Date: Dec. 16, 2021

(65) Prior Publication Data
US 2023/0201993 A1    Jun. 29, 2023

(30) Foreign Application Priority Data
Jun. 12, 2020    (JP) .................................. 2020-102456

(51) Int. Cl.
*B24B 37/08*    (2012.01)
*B24B 37/005*    (2012.01)
*B24B 37/04*    (2012.01)

(52) U.S. Cl.
CPC ............ *B24B 37/08* (2013.01); *B24B 37/005* (2013.01); *B24B 37/042* (2013.01)

(58) Field of Classification Search
CPC ... B24B 37/08; B24B 37/005; B24B 37/0053; B24B 37/04; B24B 37/042;
(Continued)

(56) References Cited

U.S. PATENT DOCUMENTS

| 3,813,828 A * | 6/1974 | Bennett ................... B24B 49/16 |
| | | 451/291 |
| 2005/0260922 A1* | 11/2005 | Gan ........................ B24B 49/16 |
| | | 451/5 |
| 2006/0035571 A1* | 2/2006 | Nakajima ............. B24B 41/007 |
| | | 451/285 |

(Continued)

FOREIGN PATENT DOCUMENTS

| JP | 2007-152499 | 6/2007 |
| JP | 2011-56630 | 3/2011 |

(Continued)

OTHER PUBLICATIONS

Translation of WO 2011157493 A1 (Year: 2011).*
(Continued)

*Primary Examiner* — David S Posigian
*Assistant Examiner* — Steven Huang
(74) *Attorney, Agent, or Firm* — Greenblum & Bernstein, P.L.C.

(57) ABSTRACT

The sum of torques: the torque of the sun gear and the torque of the internal gear, and the ratio of the torques are controlled within predetermined ranges.

16 Claims, 12 Drawing Sheets

(58) Field of Classification Search
CPC ....... B24B 37/046; B24B 37/13; B24B 37/28; B24B 49/00; B24B 49/02; B24B 49/04; B24B 49/03; B24B 49/10; B24B 49/16; B24B 51/00; B24B 1/002; B24B 7/228; B24B 27/0076
USPC ..... 451/5, 9, 10, 11, 41, 261, 262, 267, 268, 451/269, 285, 287, 290, 291
See application file for complete search history.

(56) References Cited

U.S. PATENT DOCUMENTS

| | | | | |
|---|---|---|---|---|
| 2006/0128276 | A1* | 6/2006 | Horiguchi | B24B 37/28 451/41 |
| 2007/0049166 | A1* | 3/2007 | Yamaguchi | B24B 37/345 451/8 |
| 2007/0128985 | A1 | 6/2007 | Moriya | |
| 2012/0329373 | A1* | 12/2012 | Ueno | B24B 37/013 451/262 |
| 2015/0165585 | A1* | 6/2015 | Ogata | B24B 37/08 451/5 |
| 2015/0209931 | A1* | 7/2015 | Asai | B24B 37/005 451/6 |
| 2016/0332279 | A1* | 11/2016 | Yasuda | B24B 49/16 |

FOREIGN PATENT DOCUMENTS

| | | | | |
|---|---|---|---|---|
| JP | 2014-138973 | | 7/2014 | |
| JP | 2014138973 A | * | 7/2014 | ........... B24B 37/005 |
| JP | 2016-36857 | | 3/2016 | |
| JP | 2018074086 A | * | 5/2018 | ........... B24B 37/042 |
| JP | 2019181657 A | * | 10/2019 | ............. B24B 37/00 |
| JP | 2020-49612 | | 4/2020 | |
| KR | 10-2007-0024417 | | 3/2007 | |
| KR | 10-2015-0013883 | | 2/2015 | |
| WO | WO-2011157493 A1 | * | 12/2011 | ............. B24B 37/08 |
| WO | 2014/002467 | | 1/2014 | |
| WO | WO-2017073265 A1 | * | 5/2017 | |
| WO | WO-2023127601 A1 | * | 7/2023 | ............... B24B 1/00 |

OTHER PUBLICATIONS

Translation of JP 2014138973 A (Year: 2014).*
Translation of JP 2019181657 A (Year: 2019).*
Translation of WO 2023127601 A1 (Year: 2023).*
Translation of WO 2017073265 A1 (Year: 2017).*
Translation of JP 2018074086 A (Year: 2018).*
Office Action issued in Corresponding KR Patent Application No. 10-2022-7043295, dated May 14, 2024, along with an English translation thereof.
International Search Report issued in International Patent Application No. PCT/JP2021/004304, dated Apr. 6, 2021, along with an English translation thereof.
International Preliminary Report on Patentability issued in International Patent Application No. PCT/JP2021/004304, dated Dec. 13, 2022, along with an English translation thereof.

* cited by examiner

METHOD OF DOUBLE-SIDE POLISHING WORK, METHOD OF PRODUCING WORK, AND DOUBLE-SIDE POLISHING APPARATUS FOR A WORK

TECHNICAL FIELD

This disclosure relates to a method of double-side polishing a work, a method of producing a work, and a double-side polishing apparatus for a work.

BACKGROUND

The production of a work such as a semiconductor wafer may include a process of polishing the surfaces of the work. For example, both surfaces of a work are polished with the wafer being sandwiched between upper and lower plates each having a polishing pad. In recent years, the precision required for polishing on wafers has been increased with the miniaturization of semiconductor devices. Further, in order to increase the integration degree of large-scale integrated circuits, in addition to increasing the polishing precision, improving the flatness of wafers is important. The flatness of a wafer is typically indicated using, for example, a GBIR (Global Backside Indicated Reading) value or an ESFQR (Edge flatness metric, Sector based, Front surface referenced, Site Front least sQuares Range) value. A GBIR value is mainly used to indicate the global flatness of a wafer, and an ESFQR value is mainly used to indicate the edge flatness of a wafer.

When polishing a wafer, it is necessary to precisely control the polishing conditions thereby keeping a desired rotation state of the wafer in a carrier plate in a double-side polishing apparatus using a polishing solution at a predetermined plate temperature. Accordingly, appropriately setting the rotation conditions of the polishing apparatus to achieve the objective of improving the polishing precision and wafer flatness is one of the important challenges.

For example, JP 2011-056630 A (PTL 1) discloses a polishing method in which, in double-side polishing, a polishing friction measurement means calculates the polishing friction of a wafer and transmits the polishing friction to a control means, and the control means controls the rotation ratio of a carrier plate (that is, the number of rotations of the carrier plate during one revolution thereof).

CITATION LIST

Patent Literature

PTL 1: JP 2011-056630 A

SUMMARY

Technical Problem

However, in PTL 1, reduction in the wafer polishing precision can be avoided by controlling the rotation ratio of a carrier plate, yet the improvement in the wafer polishing precision is limited. Further, such a problem may apply not only to wafers but also to any general works to be subjected to double-side polishing.

It could be helpful to provide a method of double-side polishing a work, a method of producing a work, and a double-side polishing apparatus that each make it possible to precisely control the thickness of a work being subjected to double-side polishing, thus obtaining a highly flat work.

Solution to Problem

This disclosure primarily includes the following features.

A method of double-side polishing a work, according to this disclosure, by which a work is polished in a carrier plate rotated by a sun gear and an internal gear, the method includes:
  a step of setting a polishing condition depending on a target shape of the work to be obtained by polishing;
  a step of starting polishing based on the polishing condition;
  a step of measuring a torque of the sun gear (Ti) and a torque of the internal gear (To);
  a step of calculating a value of a sum of the torques (Ti+To) of the measured torque of the sun gear (Ti) and the measured torque of the internal gear (To) and a value of a ratio of the torques (Ti/To) using a computing unit;
  a step of setting control ranges of the sum of the torques (Ti+To) and the ratio of the torques (Ti/To) using a condition setting unit; and
  a step of determining whether or not the polishing condition need to be changed based on whether or not the value of the sum of the torques (Ti+To) and the value of the ratio of the torques (Ti/To) are within the control ranges using the condition setting unit.

In an embodiment, the method further includes, before starting double-side polishing, a step of previously acquiring a relationship of the sum of the torques (Ti+To) and the ratio of the torques (Ti/To) to the target shape of the work to be obtained by polishing.

The step of setting the control ranges of the sum of the torques (Ti+To) and the ratio of the torques (Ti/To) is performed based on the acquired relationship.

In an embodiment, the target shape of the work to be obtained by polishing is determined using one or both of a GBIR value and an ESFQR value. It should be noted that "GBIR" and "ESFQR" are as prescribed by the SEMI standards.

In an embodiment, using the computing unit, the value of the torque of the sun gear (Ti) and the value of the torque of the internal gear (To) are converted to ratio values of an operating output of a motor driving the sun gear and an operating output of a motor driving the internal gear with respect to respective rated outputs,
  in determining the target shape of the work to be obtained by polishing using the GBIR value, the condition setting unit sets the control range of the sum of the torques (Ti+To) to 30 to 35, and the control range of the ratio of the torque (Ti/To) to 1.5 to 2.1, and
  the values of the ratios of the operating outputs of the motors to the rated outputs are calculated by a formula:

(value of output of the motor in operation/value of the rated output of the motor)×100.

In an embodiment, using the computing unit, the value of the torque of the sun gear (Ti) and the value of the torque of the internal gear (To) are converted to ratio values of an operating output of a motor driving the sun gear and an operating output of a motor driving the internal gear with respect to respective rated outputs, and
  in determining the target shape of the work to be obtained by polishing using the ESFQR value, the condition setting unit sets the control range of the sum of the torques (Ti+To) to 25 to 30, and the control range of the ratio of the torque (Ti/To) to 1.4 to 1.9, and the values of the ratios of the operating outputs of the motors to the rated outputs are calculated by a formula:

(value of output of the motor in operation/value of the rated output of the motor)×100.

In an embodiment, the carrier plate is placed between an upper plate and a lower plate of rotating plates, and the polishing condition is one of a rotation rate of the lower plate and a machining load applied to the work by the rotating plates.

In an embodiment, the method further includes:

a step of measuring a shape of the work using a measurement unit before polishing; and a step of dividing a step of double-side polishing the work based on the measured shape of the work into a plurality of sub-steps using the computing unit.

The step of setting control ranges of the sum of the torques (Ti+To) and the ratio of the torques (Ti/To) is performed in each of the sub-steps, and the step of determining whether or not the polishing condition need to be changed based on whether or not the value of the sum of the torques (Ti+To) and the value of the ratio of the torques (Ti/To) are within the control ranges is performed in each of the sub-steps.

In an embodiment, the plurality of sub-steps include:

a sub-step of reducing roughness in a circumferential direction of the work; and a sub-step of reducing roughness in a radial direction of the work.

In a method of producing a work, according to this disclosure, a work is produced using any one of the above methods.

A double-side polishing apparatus for a work, according to this disclosure includes:

rotating plates including an upper plate and a lower plate that are rotatable;

a sun gear placed at a center portion of the rotating plates;

an internal gear placed around a periphery of the rotating plates;

a carrier plate that is placed on the lower plate and is configured such that a work can be placed on the carrier plate and the carrier plate is rotated between the upper plate and the lower plate by the sun gear and the internal gear;

a first torque sensing device that measures a torque (Ti) of the sun gear during double-side polishing;

a second torque sensing device that measures a torque (To) of the internal gear during double-side polishing;

a computing unit that receives information of the measured torques and calculates a value of a sum of the torques (Ti+To): the torque of the sun gear (Ti) and the torque of the internal gear (To), and a value of a ratio of the torques (Ti/To) based on the torque information; and a condition setting unit configured to set a target shape of the work to be obtained by polishing and a polishing condition, and receive the value of the sum of the torques (Ti+To) and the value of the ratio of the torques (Ti/To).

The condition setting unit determines whether the polishing condition need to be changed based on whether or not the value of the sum of the torques (Ti+To) and the value of the ratio of the torques (Ti/To) are within control ranges.

In an embodiment, the double-side polishing apparatus further comprises a storage unit previously storing a relationship of the sum of the torques (Ti+To) and the ratio of the torques (Ti/To) to the target shape of the work, and/or the condition setting unit includes a communication unit that can receive the relationship, and before double-side polishing the condition setting unit either acquires the relationship from the storing unit or acquires the relationship from the external using the communication unit, and sets control ranges of the sum of the torques (Ti+To) and the ratio of the torques (Ti/To) based on the acquired relationship.

In an embodiment, the condition setting unit determines a target shape of the work to be obtained by polishing using one or both of a GBIR value and an ESFQR value.

In an embodiment, using the computing unit, the value of the torque of the sun gear (Ti) and the value of the torque of the internal gear (To) are converted to ratio values of an operating output of a motor driving the sun gear and an operating output of a motor driving the internal gear with respect to respective rated outputs, in determining the target shape of the work to be obtained by polishing using the GBIR value, the condition setting unit sets the control range of the sum of the torques (Ti+To) to 30 to 35, and the control range of the ratio of the torque (Ti/To) to 1.5 to 2.1, and the values of the ratios of the operating outputs of the motors to the rated outputs are calculated by a formula:

(value of output of the motor in operation/value of the rated output of the motor)×100.

In an embodiment, using the computing unit, the value of the torque of the sun gear (Ti) and the value of the torque of the internal gear (To) are converted to ratio values of an operating output of a motor driving the sun gear and an operating output of a motor driving the internal gear with respect to respective rated outputs, in determining the target shape of the work to be obtained by polishing using the ESFQR value, the condition setting unit sets the control range of the sum of the torques (Ti+To) to 25 to 30, and the control range of the ratio of the torque (Ti/To) to 1.4 to 1.9, and the values of the ratios of the operating outputs of the motors to the rated outputs are calculated by a formula:

(value of output of the motor in operation/value of the rated output of the motor)×100.

In an embodiment, the condition setting unit further includes a machine learning device that automatically sets a polishing condition on the condition setting unit by a method of machine learning such that one or both of a desired GBIR value and a desired ESFQR value is satisfied based on the sum of the torques (Ti+To) and the ratio of the torques (Ti/To).

In an embodiment, the apparatus further includes a first motor connected to the sun gear and a second motor connected to the internal gear.

The first torque sensing device that measures the torque of the first motor rotating the sun gear as the toque (Ti) of the sun gear, and the second torque sensing device measures the torque of the second motor rotating the internal gear as the torque (To) of the internal gear.

In an embodiment, the apparatus further includes a lower plate motor connected to the lower plate.

The condition setting unit is configured to control the rotation rate of the lower plate using the lower plate motor, the rotating plates vertically apply a machining load to the work, and the condition setting unit is configured to control the machining load, and the condition setting unit changes the polishing condition by changing one of the rotation rate of the lower plate and the machining load.

Advantageous Effect

This disclosure can provide a method of double-side polishing a work, a method of producing a work, and a double-side polishing apparatus that each make it possible to precisely control the thickness of a work being subjected to double-side polishing, thus obtaining a highly flat work.

DETAILED DESCRIPTION

Embodiments of this disclosure will now be described in detail with reference to the drawings.

Figure 1A:
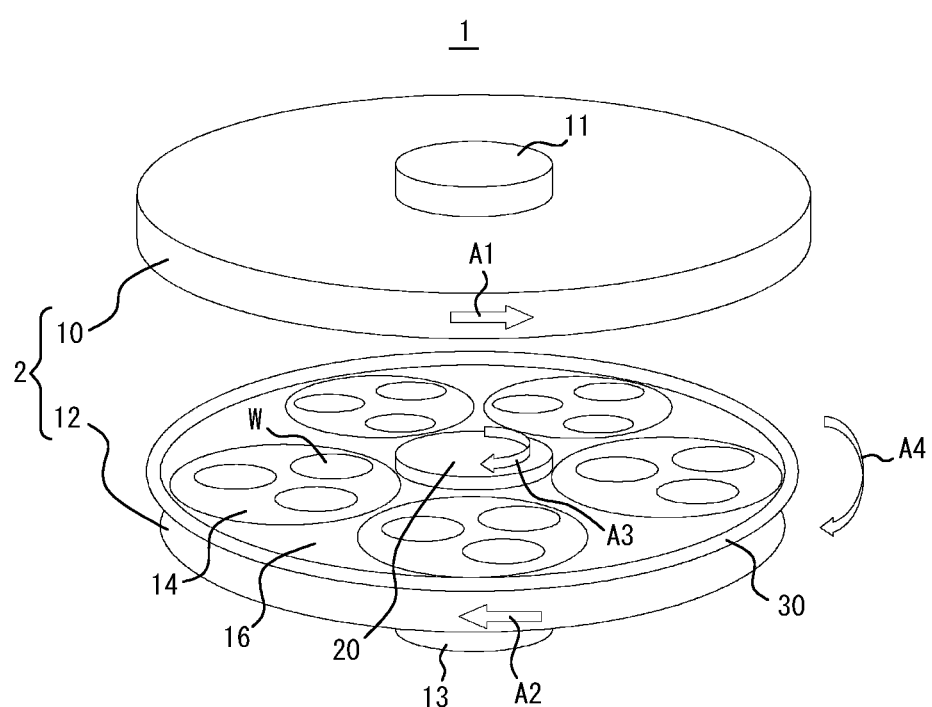
FIG. 1A is a perspective view illustrating a double-side polishing apparatus for a work, according to an embodiment of this disclosure.
Figure 1B:
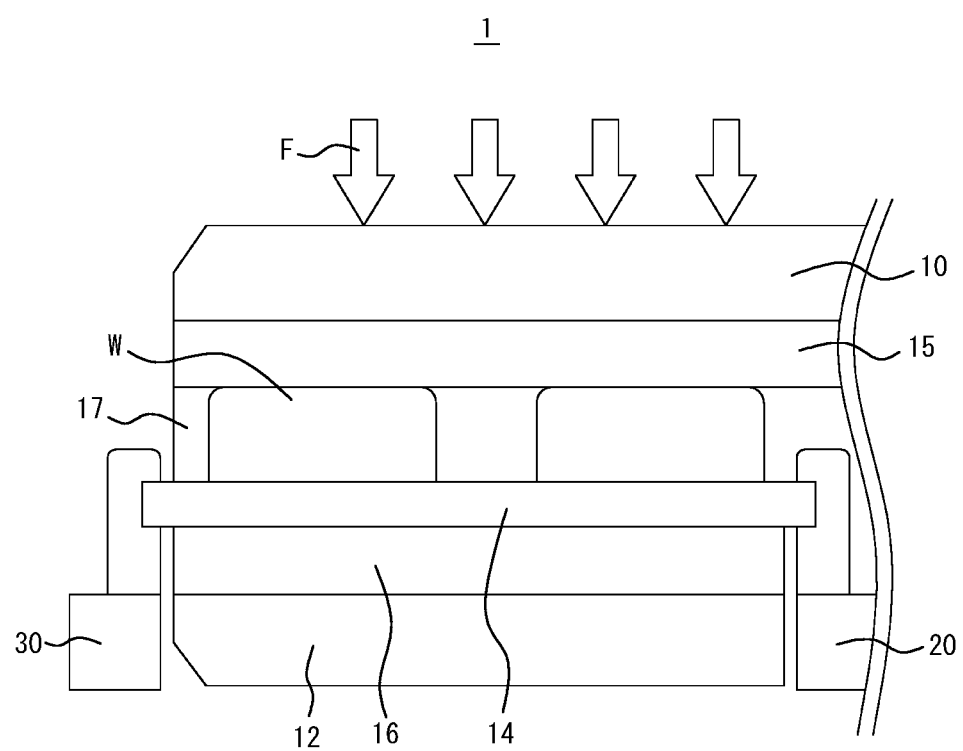
FIG. 1B is a fragmentary cross-sectional view illustrating the double-side polishing apparatus for a work, according to the embodiment of this disclosure.

As illustrated in FIG. 1A and FIG. 1B, a double-side polishing apparatus 1 according to one embodiment of this disclosure includes rotating plates 2, an upper plate motor 11, a lower plate motor 13, carrier plates (five in the illustration) 14, an upper polishing pad 15, a lower polishing pad 16, a sun gear 20, and an internal gear 30. The rotating plates 2 include an upper plate 10 and a lower plate 12 that are rotatable. The upper plate motor 11 rotates the upper plate 10, and the lower plate motor 13 rotates the lower plate 12. Further, the upper polishing pad 15 and the lower polishing pad 16 used for polishing are attached to the lower surface of the upper plate 10 and the upper surface of the lower plate 12, respectively. The sun gear 20 is placed at a center portion of the rotating plates 2, and the internal gear 30 is placed around the periphery of the rotating plates 2. In this embodiment, the carrier plates 14 are placed to surround the sun gear 20, and wafers W are placed thereon. The carrier plates 14 are rotated between the upper plate 10 and the lower plate 12 by the sun gear 20 and the internal gear 30. Note that the number of the carrier plates 14 provided is not limited and can be appropriately determined; for example, only one carrier plate 14 may be provided.

As illustrated in FIG. 1A, in this embodiment, when the wafers W are polished, the rotation direction A1 of the upper plate 10 is a counterclockwise direction in the illustration, the rotation direction A2 of the lower plate 12 is a clockwise direction in the illustration, the rotation direction A3 of the sun gear 20 is a clockwise direction in the illustration, and the rotation direction A4 of the internal gear 30 is a clockwise direction in the illustration. However, the rotation directions are not limited to those, and can be appropriately determined, for example, the rotation direction A1 may be a clockwise direction, and the rotation direction A2 may be a counterclockwise direction.

Further, as illustrated in FIG. 1B, when the wafer W is polished, a polishing solution 17 is supplied into the double-side polishing apparatus 1. The carrier plates 14 are provided between the lower polishing pad 16 of the lower plate 12 and the upper polishing pad 15 of the upper plate 10. Both surfaces of the wafers W placed on the carrier plates 14 are simultaneously subjected to chemical mechanical polishing using the lower polishing pad 16 of the lower plate 12 and the upper polishing pad 15 of the upper plate 10, and the polishing solution 17 supplied to the wafers W.

Figure 2:
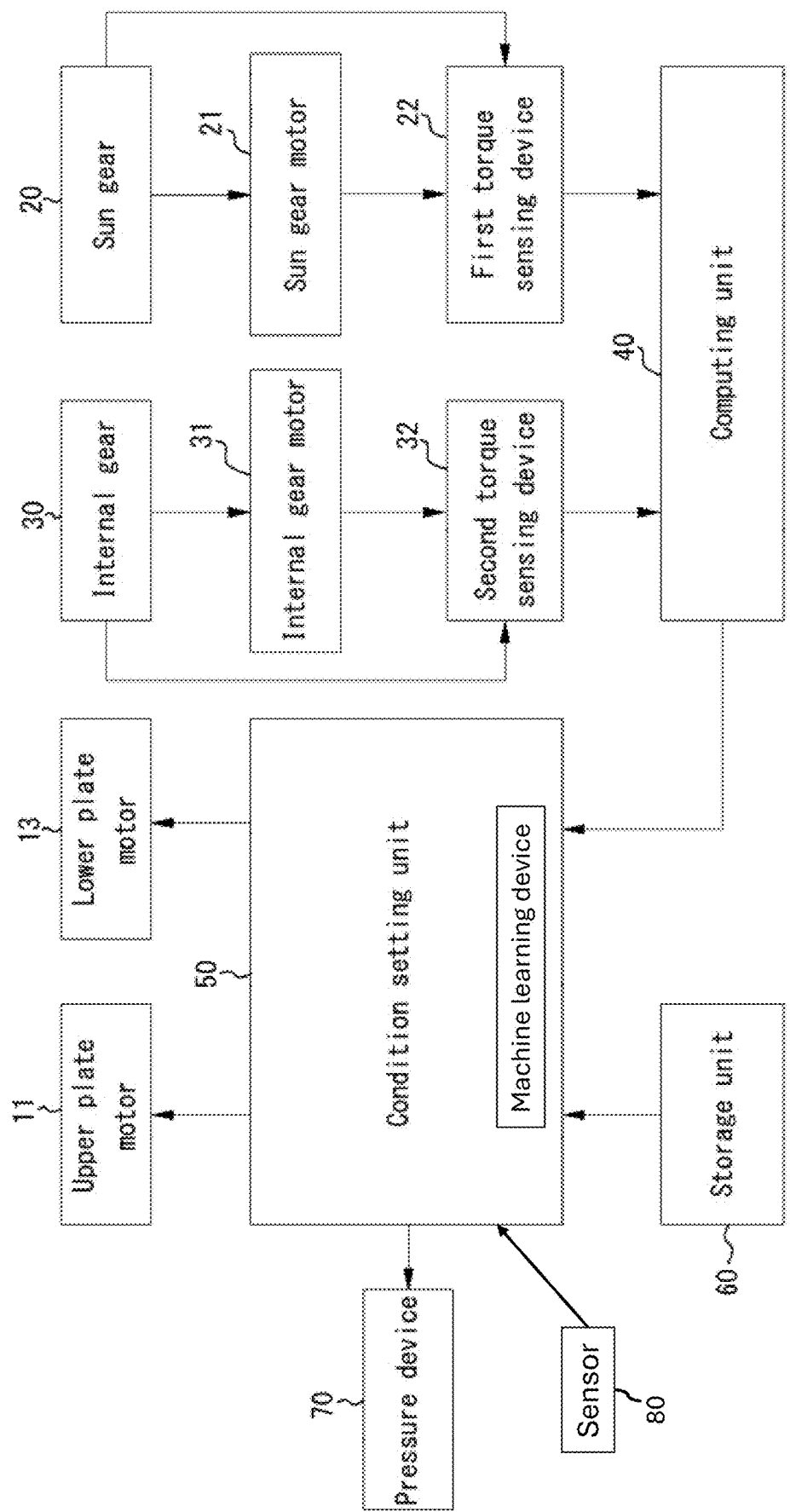
FIG. 2 is a block diagram illustrating the double-side polishing apparatus for a work, according to the embodiment of this disclosure.

Referring to FIG. 2, the double-side polishing apparatus 1 further includes a sun gear motor (first motor) 21, a first torque sensing device 22, an internal gear motor (second motor) 31, and a second torque sensing device 32. The sun gear 20 is driven (rotated) by the sun gear motor 21. The first torque sensing device 22 is connected (electrically in this example) to the sun gear 20 and the sun gear motor 21. During polishing, the first torque sensing device 22 directly measures the torque Ti of the sun gear 20 or measures the torque of the sun gear motor 21 rotating the sun gear 20 as the torque Ti of the sun gear 20. Further, the internal gear 30 is driven (rotated) by the internal gear motor 31. The second torque sensing device 32 is connected (electrically in this example) to the internal gear 30 and the internal gear motor 31. During polishing, the second torque sensing device 32 directly measures the torque To of the internal gear 30 or measures the torque of the torque of the internal gear motor 31 or the internal gear 30 as the torque To of the internal gear 30. The torque sensing device can use, for example, a given known torque sensor.

Subsequently, referring to FIG. 2, the double-side polishing apparatus 1 further includes a computing unit 40, a condition setting unit 50, a storage unit 60, and a pressure device 70. The computing unit 40 is connected (electrically in this example) to the first torque sensing device 22 and the second torque sensing device 32 and receives torque information. Based on the torque information, the computing unit

40 calculates the value of the sum of torques Ti+To: the torque Ti of the sun gear 20 and the torque To of the internal gear 30, and the value of the ratio of the torques Ti/To, processes the values, and then sends the values to the setting unit 50. Note that the computing unit 40 may be configured to include a communication unit and (wirelessly) receive the torque information using the communication unit. The computing unit 40 may use, for example, a given known computer.

The condition setting unit 50 sets the shape of the wafers W to be obtained by polishing and polishing conditions, is connected (electrically in this example) to the computing unit 40, receives the value of the sum Ti+To of the torques of the sun gear 20 and the internal gear 30 and the value of the ratio Ti/To of the torques, determines how to control the rotation rate of the upper plate 10 and the lower plate 12 based on the values, and/or controls the pressure device 70. Note that the condition setting unit 50 may be configured to include a communication unit and (wirelessly) receive the value of the sum of the torques and the value of the ratio of the torques using the communication unit. The condition setting unit 50 may be a given known processor. The pressure device 70 allows the rotating plates 2 to vertically apply a machining load F to the wafers W. The storage unit 60 is connected (electrically in this example) to the condition setting unit 50, and previously stores the relationship of the sum of the torques (Ti+To) and the ratio of the torques (Ti/To) to the shape of the wafers W to be obtained by polishing. The storage unit 60 may be a given known memory.

Subsequently, the reason the condition setting unit 50 should control the rotation rate of the rotating plates or the machining load. For the double-side polishing apparatus, the control factors relating to the forces applied to the wafers include, for example, the torque of the upper plate, the torque of the lower plate, the torque of the internal gear, the torque of the sun gear, and the like. The present inventors analyzed the correlation of the state of the forces applied to the wafers in the carrier plates in the double-side polishing apparatus and the wafer shape, and found that the torque of the sun gear and the torque of the internal gear are main factors that have effects on the GBIR value and the ESFQR value of the wafers. The present inventors thus found that the precision of polishing of wafers can be favorably controlled by controlling the sum of torques: the torque of the sun gear and the torque of the internal gear, and the ratio of the torques within predetermined ranges.

Figure 3:
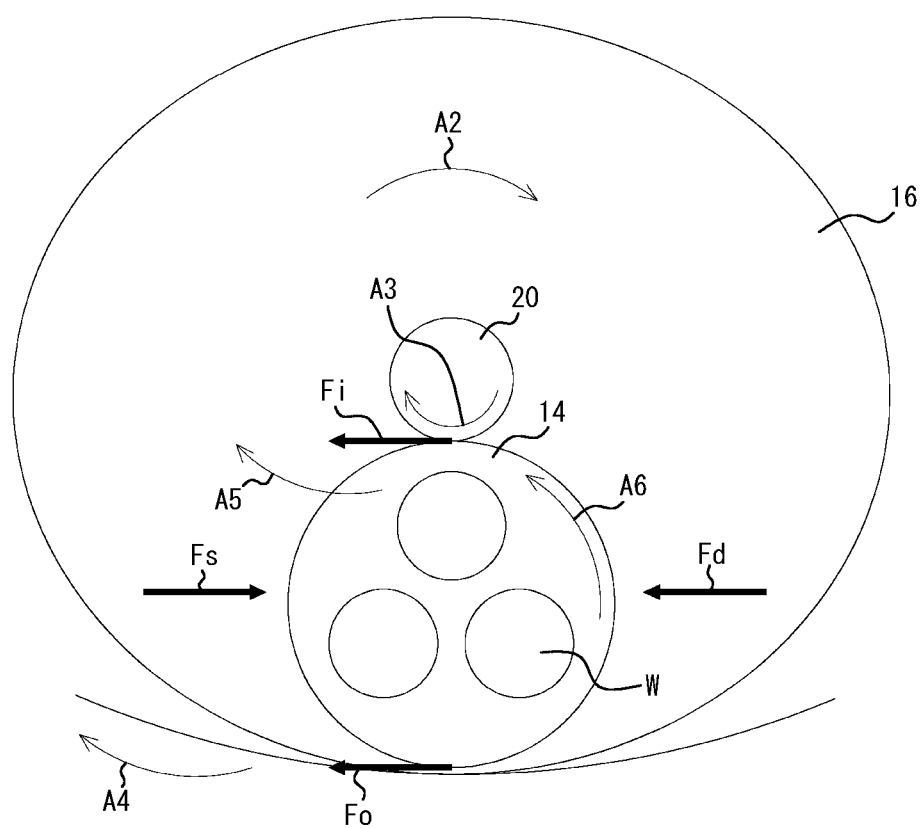
FIG. 3 is a diagram illustrating the forces wafers are subjected to while being polished in a double-side polishing apparatus.

Referring to both FIG. 1A and FIG. 3, the state of the forces applied to the wafers W during polishing is described. As described above, the rotation direction A2 of the lower plate 12 is a clockwise direction, the rotation direction A3 of the sun gear 20 is a clockwise direction, the rotation direction A4 of the internal gear 30 is a clockwise direction, the direction of revolution A5 of the carrier plates 14 is a clockwise direction, and the direction of rotation A6 of the carrier plate 14 is a counterclockwise direction. In this case, the wafers W being polished are subjected to four forces in total: the force Fi applied to the carrier plates 14 by the rotation of the sun gear 20, the force Fo applied to the carrier plate 14 by the rotation of the internal gear 30, the force Fd (caused by the rotation of the lower plate 12) applied to the carrier plates 14 by the lower polishing pad 16, and the frictional force Fs ("normal force", i.e., a force caused by the machining load F) generated by the carrier plates 14. The present inventors assumed cases where the carrier plates 14 can revolve clockwise and rotate counterclockwise, and conducted mechanical analyses using the torque principle.

First, when the carrier plates 14 can revolve clockwise, the following formula (1) can be obtained.

$$Fo \times ro + Fi \times ri + Fd \times (rc+ri) > Fs \times (rc+r) \quad (1),$$

where ri is the outer diameter of the sun gear 20, ro is the inner diameter of the internal gear 30, and Rc is the radius of the carrier plate 14.

Rearranging the formula (1) gives the following formula (2).

$$To + Ti + m \times (rc+ri) \times \alpha \times (rc+ri) > \mu \times F \times (rc+ri) \quad (2),$$

where To is the torque of the sun gear 20, Ti is the torque of the internal gear 30, F is the machining load, m is the mass of the lower plate 12, and a is the angular acceleration of the lower plate 12.

Rearranging the formula (2) gives the following formula (3).

$$To + Ti > F \times X - \alpha \times Y \quad (3),$$

where X and Y are constants.

Next, when the carrier plates 14 can rotate counterclockwise, the following formula (4) can be obtained.

$$Fi \times rc > Fo \times rc \quad (4)$$

Multiplying both sides of Formula (4) by both ro and ri gives the following formula (5).

$$Fi \times rc \times ro \times ri > Fo \times rc \times ro \times ri \quad (5)$$

Rearranging the formula (5) gives the following formula (6).

$$Ti/To > ri/ro \quad (6),$$

where ri divided by ro is a constant.

Further, dividing both sides of Formula (3) by To and then rearranging the formula gives the following formula (7).

$$Ti/To > (F \times X - \alpha \times Y)/To - 1 \quad (7)$$

Rearranging Formula (6) and Formula (7) together gives the following formula (8).

$$Ti/To > (F \times X - \alpha \times Y)/To - 1 > ri/ro \quad (8).$$

Finally, Formula (3) and Formula (8) indicate that the sum of the torques Ti+To of the sun gear 20 and the internal gear 30 and the ratio of the torques Ti/To are related to the machining load F and the angular acceleration of the lower plate 12.

Accordingly, controlling the machining load F and the rotation rate of the lower plate 12 (namely, controlling the output of the lower plate motor 13) can control the sum of the torques Ti+To of the sun gear 20 and the internal gear 30 and the ratio of the torques Ti/To.

Further, as described above, the present inventors found that the sum of the torques Ti+To of the torque To of the sun gear 20 and the torque Ti of the internal gear 30 and the ratio of the torques Ti/To are main factors that have effects on the GBIR value and the ESFQR value of the wafers. The inventors then conducted experiments based on the results of the mechanical analyses described above, and obtained the relationship diagrams of the rates of change of GBIR and ESFQR with the sum of torques Ti+To and the ratio of torques Ti/To in FIG. 4A to FIG. 4D. The rate of change of GBIR and the rate of change of ESFQR on the vertical axes are ratio values, and the units of Ti/To on the horizontal axes are the ratio values. It should especially be noted that the unit for the sum of torques Ti+To in FIG. 4A, FIG. 4C, and this specification is not a typical unit for torque, and is a value obtained by converting the values of the torque Ti of the sun gear 20 and the torque To of the internal gear 30 into the ratios of the values to the rated outputs of the operating outputs of the sun gear motor 21 and the internal gear motor 31 that are the motors corresponding to the respective gears and then adding the values of the ratios of the two motor operating outputs. Further, the value of the ratio of the operating output of each motor to the rated output can be calculated by a formula:

(value of output of motor in operation/value of rated output of the motor)×100.

This means that when the value of the ratio of the operating output of a motor to the rated output is for example 15, the operating output of the motor in operation is 15% of the rated output. Further, in a case of a motor with current control at a constant voltage, the output value may be replaced with the current value.

Figure 4A:
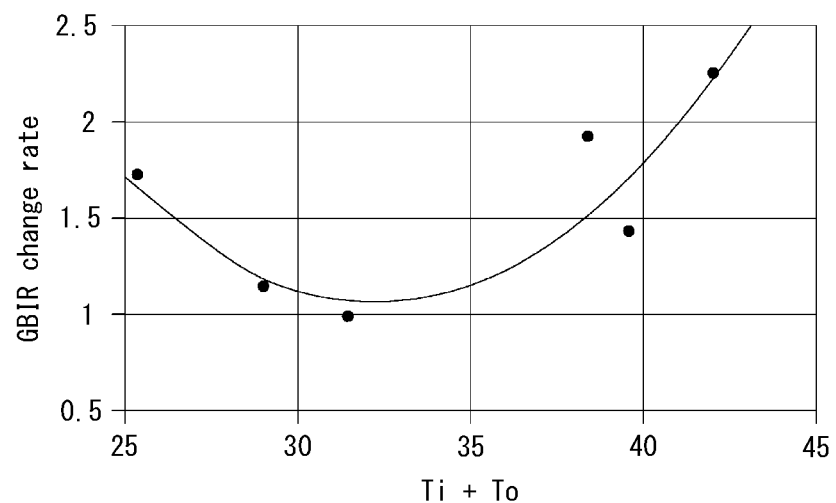
FIG. 4A is a diagram illustrating the relationship between the sum of the torques of the sun gear and the internal gear (Ti+To) and the rate of change of GBIR.
Figure 4B:
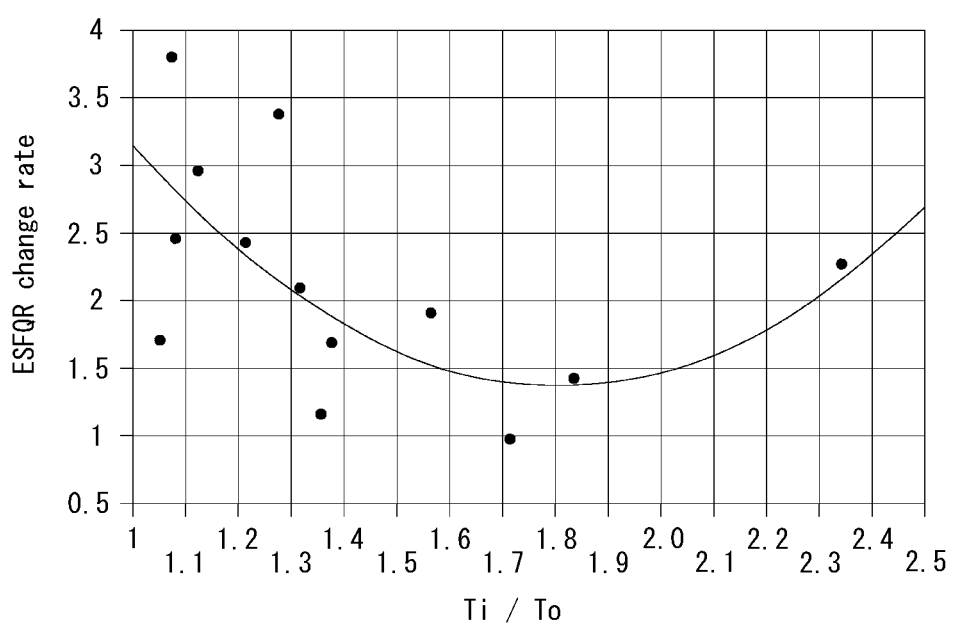
FIG. 4B is a diagram illustrating the relationship between the ratio of the torques of the sun gear and the internal gear (Ti/To) and the rate of change of GBIR.

Referring to FIG. 4A and FIG. 4B, when the control range of the sum of torques Ti+To is 30 to 35 and when the control range of the ratio of torques Ti/To is 1.5 to 2.1, the rate of change of the GBIR is relatively small; in other words, the global flatness of the wafers W is relatively high. Therefore, in this embodiment, when the shape of the wafers W to be obtained by polishing is determined using the GBIR value, preferably, the control range of the sum of torques Ti+To is set to 30 to 35 and the control range of the ratio of torques Ti/To is set to 1.5 to 2.1. It should especially be noted that in the relationship diagrams of the rate of change of GBIR in FIG. 4A and FIG. 4B, as the value on the horizontal axis is larger, the global shape of the wafers W changes from a concave shape into a convex shape. Further, as described above, the rate of change of GBIR is a ratio value, and is defined as the GBIR value of a wafer/the minimum GBIR value of the wafers. Namely, in FIG. 4A and FIG. 4B, the rate of change of GBIR of the wafer having the best (minimum) GBIR value is 1.

Figure 4C:
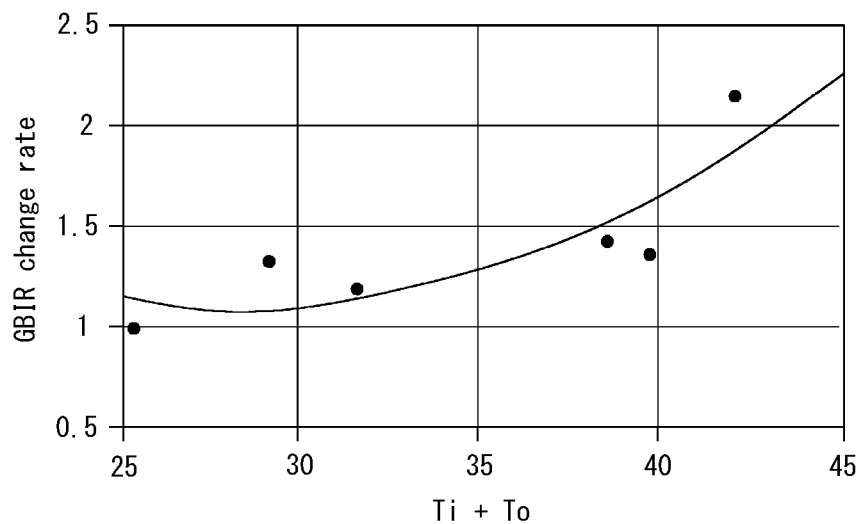
FIG. 4C is a diagram illustrating the relationship between the sum of the torques of the sun gear and the internal gear (Ti+To) and the rate of change of ESFQR.
Figure 4D:
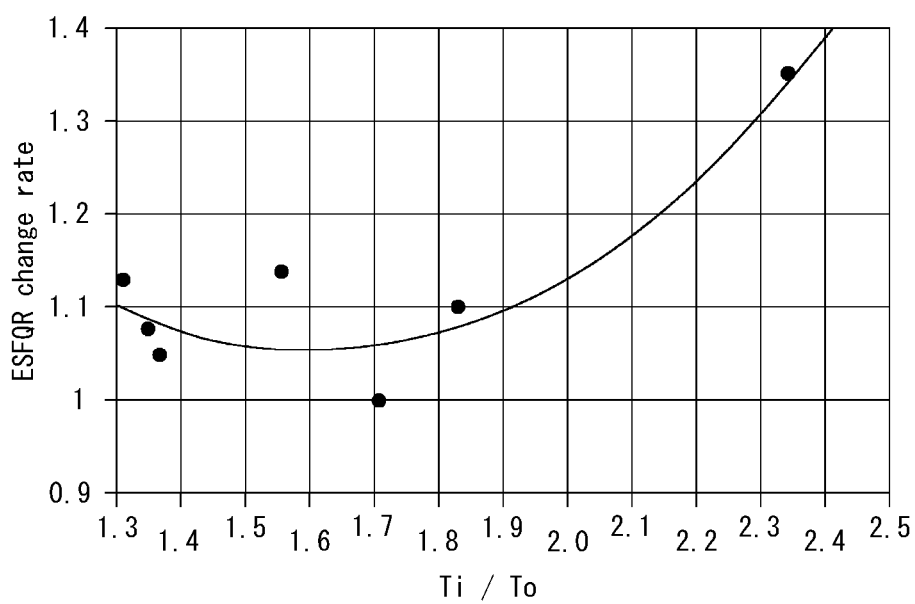
FIG. 4D is a diagram illustrating the relationship between the ratio of the torques of the sun gear and the internal gear (Ti/To) and the rate of change of ESFQR.

Next, referring to FIG. 4C and FIG. 4D, when the control range of the sum of torques Ti+To is 25 to 30, and the control range of the ratio of torques Ti/To is 1.4 to 1.9, the rate of change of ESFQR is relatively small; in other words, the flatness of the periphery of the wafers W is relatively high. Therefore, in this embodiment, when the shape of the wafers W to be obtained by polishing is determined using the ESFQR value, preferably, the control range of the sum of torques Ti+To is set to 25 to 30 and the control range of the ratio of torques Ti/To is set to 1.4 to 1.9. It should especially be noted that in the relationship diagrams of the rate of change of ESFQR in FIG. 4C and FIG. 4D, as the value on the horizontal axis is larger, the shape of the periphery of the wafers W changes from a sloped shape that is lower inside and higher more on the outside to a sloped shape that is higher inside and lower more on the outside. Further, as described above, the rate of change of ESFQR is a ratio value, and is defined as the ESFQR value of a wafer/the minimum ESFQR value of the wafers. Namely, in FIG. 4C and FIG. 4D, the rate of change of ESFQR of the wafer having the best (minimum) ESFQR value is 1.

The present inventors explain the cause of the above change of the shape of the wafers W as follows. That is, when the sum of torques Ti+To is too small, the revolution action of the carrier plates 14 is inhibited, which means that the speed of movement of the wafers W is reduced during polishing and the contact ratio of the abrasive grains in the polishing solution 17 with the center of the wafers W is increased, thus the amount removed by polishing from the center of the wafers W is larger than the amount removed by polishing from the periphery of the wafers W. Therefore, the shape of the wafers W is likely to be a concave shape. On the other hand, when the sum of torques Ti+To is too large, the revolving rate of the carrier plates 14 is increased, which means that the speed of movement of the wafers W is increased during polishing and the contact ratio of the abrasive grains in the polishing solution 17 with the periphery of the wafers W is increased, thus the amount removed by polishing from the periphery of the wafers W is larger than the amount removed by polishing from the center of the wafers W. Therefore, the shape of the wafers W is likely to be a convex shape.

Further, when the ratio of torques Ti/To is too small, the shapes after polishing are likely to be uneven. This is attributed to that the rotation of the carrier plates 14 becomes not smooth, and the amount removed by polishing from the periphery of each wafer W varies, thus the shapes of the periphery of the wafers W are likely to be uneven. On the other hand, when the ratio of torques Ti/To is too large, the rate of rotation of the carrier plates 14 is increased, which increases the amount removed by polishing from the periphery of each wafer W, thus the wafers W are likely to have a convex shape.

Figure 5:
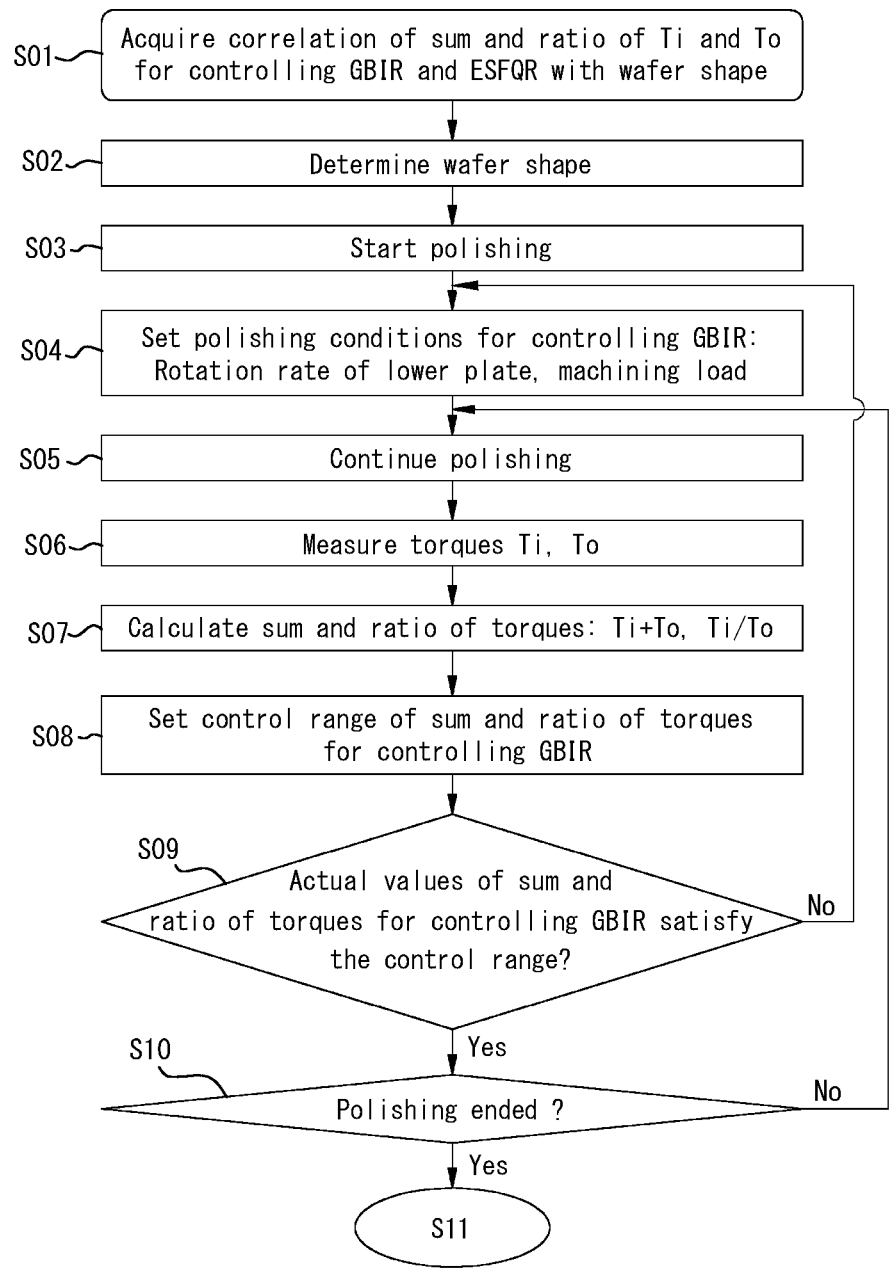
FIG. 5 is a flowchart of a method of double-side polishing a work, according to an embodiment of this disclosure.
Figure 6:
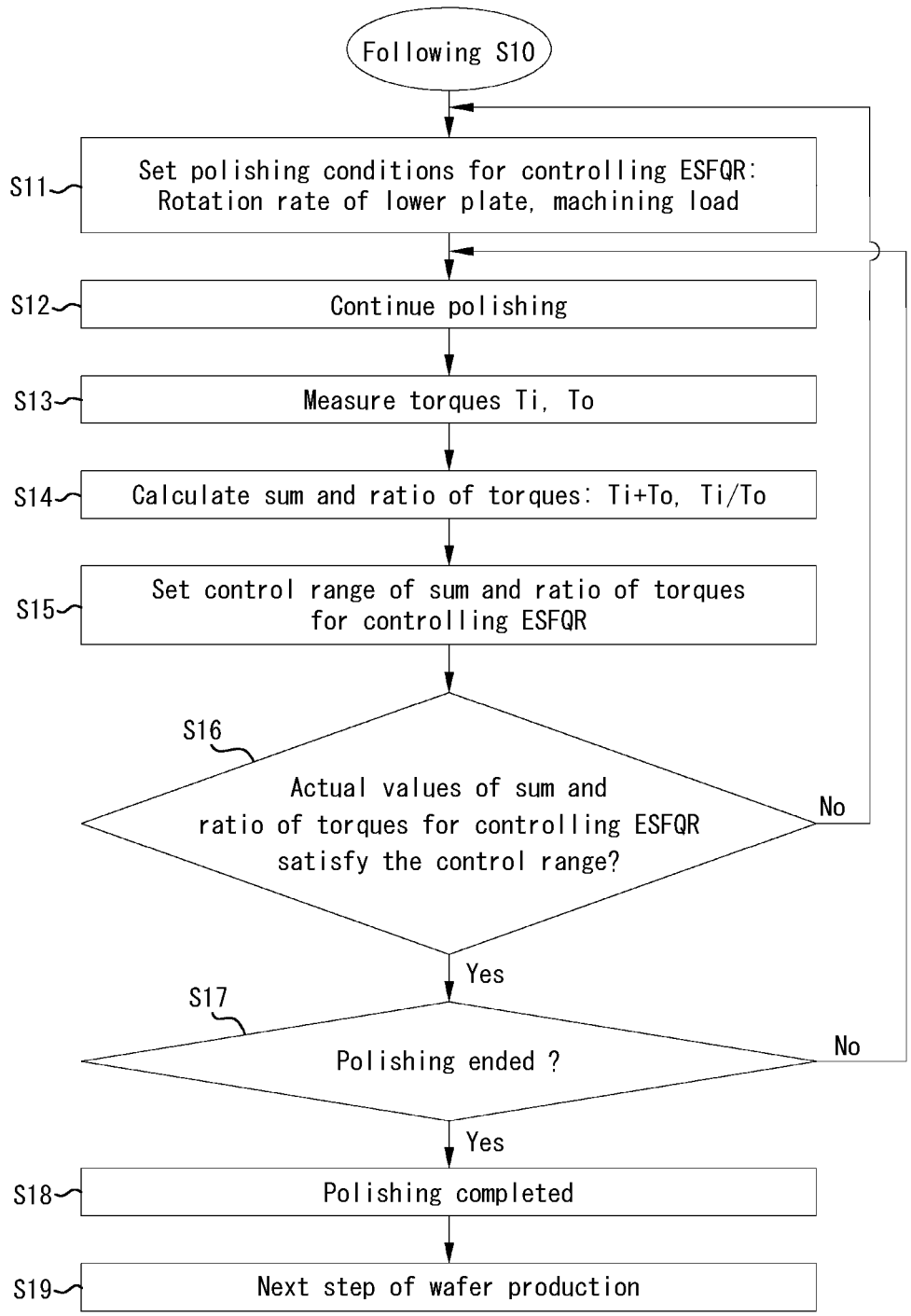
FIG. 6 is a flowchart of the steps subsequent to the steps in FIG. 5.

Next, see both FIG. 5 and FIG. 6. These are flowcharts of a method of double-side polishing a work, according to an embodiment of this disclosure.

In Step S01, the condition setting unit 50 acquires the correlation of the sum of torques Ti+To and the ratio of torques Ti/To for controlling GBIR and ESFQR from the storage unit 60 with the shape of the wafers W before starting double-side polishing. Note that the correlation may be received from the external using a communication unit.

Next, in Step S02, the shape of the current wafers W (before starting double-side polishing) is measured using a measurement unit. The measurement unit may use a measurement device such as a given known sensor 80 capable of measuring the thickness of wafers.

Next, in Step S03, polishing using the double-side polishing apparatus 1 is started.

After starting polishing, in Step S04, first, polishing for controlling the GBIR (that is, polishing for making the whole wafer flat) is performed. The condition setting unit 50 now sets the polishing conditions depending on the desired shape of the wafers W to be obtained by polishing, based on the previously acquired correlation of the sum of torques Ti+To and the ratio of torques Ti/To with the shape of the wafers W, in relation to the GBIR. Specifically, the condition setting unit 50 sets the rotation rate 12 of the lower plate or the machining load F applied by the pressure device.

Subsequently, in Step S05, polishing on the wafer W is carried on under the polishing conditions set in Step S04.

With the wafer W being continuously polished, in Step S06, the first torque sensing device 22 measures the torque Ti of the sun gear motor 21, and the second torque sensing device 32 measures the torque To of the internal gear motor 31.

Next, in Step S07, the computing unit 40 acquires the torque Ti and the torque To from the first torque sensing device 22 and the second torque sensing device 32, and converts the value of the torque Ti and the value of the torque To into the ratio values of the operating outputs of the respective motors to the rated outputs, and then obtains the sum of the torques Ti+To and the ratio of the torques Ti/To.

Next, in Step S08, the condition setting unit 50 sets the control ranges of the sum of the torques Ti+To and the ratio of the torques Ti/To depending on the desired shape of the wafers W, based on the previously acquired correlation of the sum of torques Ti+To and the ratio of torques Ti/To with the shape of the wafers W, in relation to the GBIR.

Subsequently, in Step S09, the condition setting unit 50 receives the values of the sum of torques Ti+To and the ratio of torques Ti/To from the computing unit 40, and determines whether the value of the sum of the torques Ti+To and the value of the ratio of the toques Ti/To are within the control ranges or not. When either one of the values of the sum of torques Ti+To and the ratio of torques Ti/To is out of the control range, the process proceeds to Step S04, and the rotation rate of the lower plate 12 or the machining load F applied by the pressure device is newly set. When both values of the sum of torques Ti+To and the ratio of torques Ti/To satisfy the control ranges, the process proceeds to Step S10.

In Step S10, whether polishing relating to GBIR has ended or not is determined. When polishing has not ended, the process proceeds to Step S05; when polishing has ended, the process proceeds to Step S11 and polishing for ESFQR (that is, polishing for making the periphery of the wafers flat) is performed.

In Step S11, the condition setting unit 50 sets polishing conditions depending on the desired shape of the wafers W to be obtained by polishing, based on the previously acquired correlation of the sum of torques Ti+To and the ratio of torques Ti/To with the shape of the wafers W, in relation to the ESFQR. Specifically, the condition setting unit 50 sets the rotation rate 12 of the lower plate or the machining load F applied by the pressure device.

Next, in Step S12, polishing is carried on based on the polishing conditions set in Step S11.

With the wafer W being continuously polished, in Step S13, the first torque sensing device 22 measures the torque Ti of the sun gear motor 21, and the second torque sensing device 32 measures the torque To of the internal gear motor 31.

Next, in Step S14, the computing unit 40 acquires the torque Ti and the torque To from the first torque sensing device 22 and the second torque sensing device 32, and converts the values of the torque Ti and the torque To into the ratio values of the operating outputs of the respective motors to the rated outputs, and then obtains the sum of the torques Ti+To and the ratio of the torques Ti/To.

Next, in Step S15, the condition setting unit 50 sets the control ranges of the sum of the torques Ti+To and the ratio of the torques Ti/To depending on the desired shape of the wafers W, based on the previously acquired correlation of the sum of torques Ti+To and the ratio of torques Ti/To with the shape of the wafers W, in relation to the ESFQR.

Subsequently, in Step S16, the condition setting unit 50 receives the values of the sum of torques Ti+To and the ratio of torques Ti/To from the computing unit 40, and determines whether the value of the sum of the torques Ti+To and the value of the ratio of the toques Ti/To are within the control ranges or not. When either one of the values of the sum of torques Ti+To and the ratio of torques Ti/To is out of the control range, the process proceeds to Step S11, and the rotation rate of the lower plate 12 or the machining load F applied by the pressure device is newly set. When both values of the sum of torques Ti+To and the ratio of torques Ti/To satisfy the control ranges, the process proceeds to Step S17.

In Step S17, whether polishing for ESFQR has ended or not is determined. When polishing has not ended, the process proceeds to Step S12. When polishing has ended, the process proceeds to Step S18, thus polishing is completed.

Next, in Step S19, the wafers W are subjected to the next step of production. Specifically, the wafers W leave the double-side polishing apparatus 1 and are transferred to the next apparatus.

Examples

Table 1 and Table 2 below illustrate the results of polishing according to experimental examples according to this disclosure. Table 1 illustrates the machining load settings, the measured torques, and the results of polishing in the experimental examples. In each experimental example, silicon wafers on which no device was formed were used as wafers to be polished.

TABLE 1

| | Machining load (daN) | Sun gear torque (Ti) | Internal gear torque (To) | Ti + To | Ti/To | GBIR change rate | ESFQR change rate |
|---|---|---|---|---|---|---|---|
| Experimental Example 1 | 1000 | 23.4 | 14.98 | 38.38 | 1.56 | 2.19 | 1.04 |
| Experimental Example 2 | 800 | 16.66 | 13.26 | 29.92 | 1.26 | 2.76 | 1.12 |
| Experimental Example 3 | 1200 | 25.59 | 14 | 39.59 | 1.83 | 1 | 1 |
| Experimental Example 4 | 1400 | 29.45 | 12.58 | 42.03 | 2.34 | 1.56 | 1.57 |

Further, polishing conditions that were common to the experimental examples in Table 1 were as follows:
 Polishing pad: a polishing pad which was made of a polyurethane foam material, and had basic characteristics of for example a thickness of approximately 1 mm, a hardness (Shore A) of 80 to 88 (°), and a compressibility of 1.4 to 3.4(%);
 Polishing solution: a polishing solution having basic characteristics of for example an average abrasive grain particle size of 45 to 65 (nm), a specific gravity of 1.15 to 1.16, a PH value of 10.8 to 11.8;
 Type of carrier plate: a stainless-steel substrate coated with a DLC coating material;
 Upper plate rotation rate: −9.4 rpm (the minus sign indicates counterclockwise rotation);
 Lower plate rotation rate: 25 rpm;
 Sun gear rotation rate: 25 rpm; and
 Internal gear rotation rate: 4 rpm.

The shape of wafers having been polished can be measured using a conventional measuring instrument. For a measurement of GBIR, the measurement range was 298 mm, excluding an edge of 1 mm. For a measurement of ESFQR, the measurement range was 298 mm, excluding an edge of 1 mm (length: 35 mm, radian: 5°).

Figure 7A:
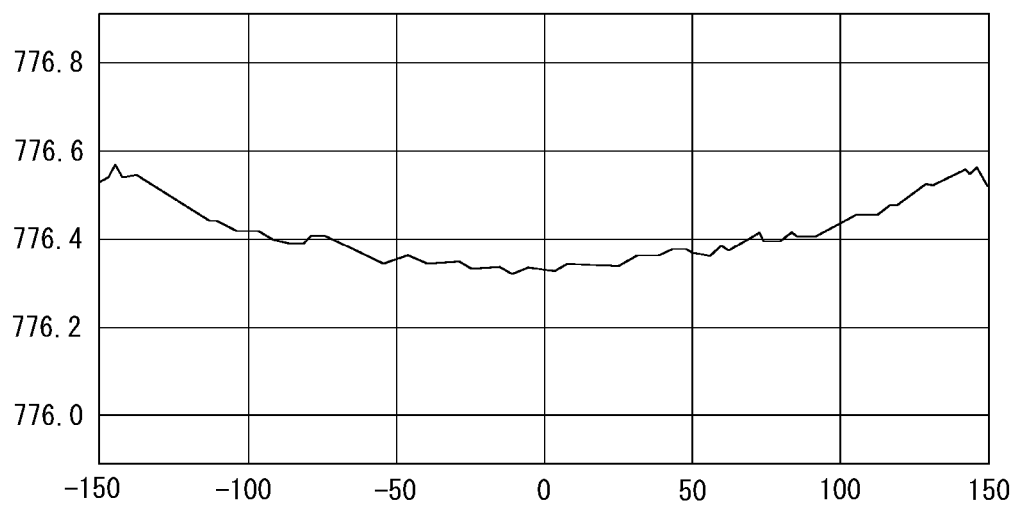
FIG. 7A is a diagram illustrating the thickness of a wafer having been polished in Experimental Example 1 in Table 1.
Figure 7B:
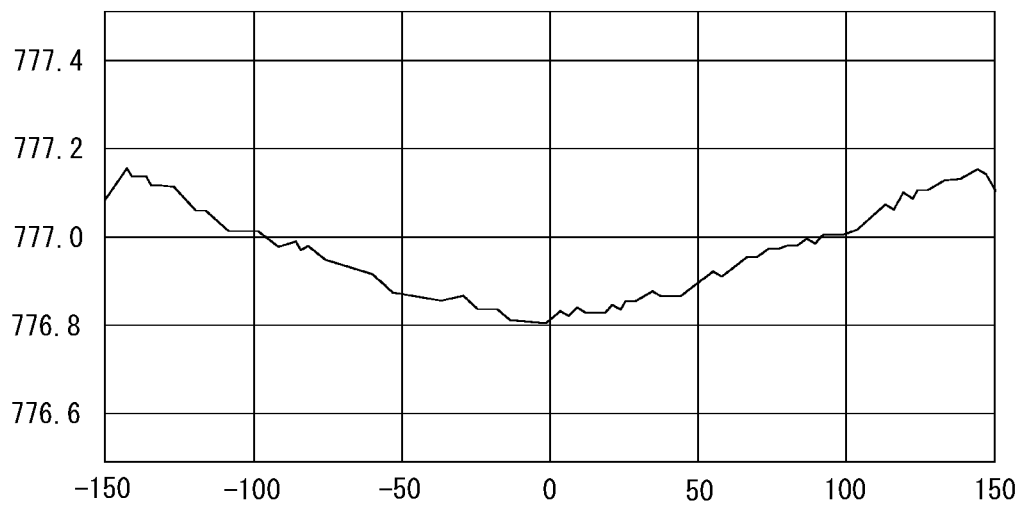
FIG. 7B is a diagram illustrating the thickness of a wafer having been polished in Experimental Example 2 in Table 1.
Figure 7C:
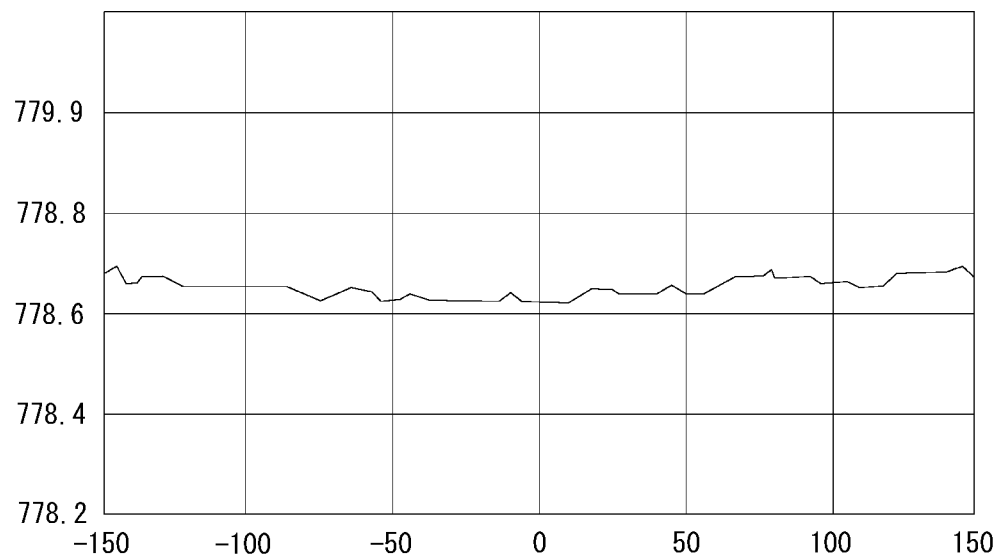
FIG. 7C is a diagram illustrating the thickness of a wafer having been polished in Experimental Example 3 in Table 1.
Figure 7D:
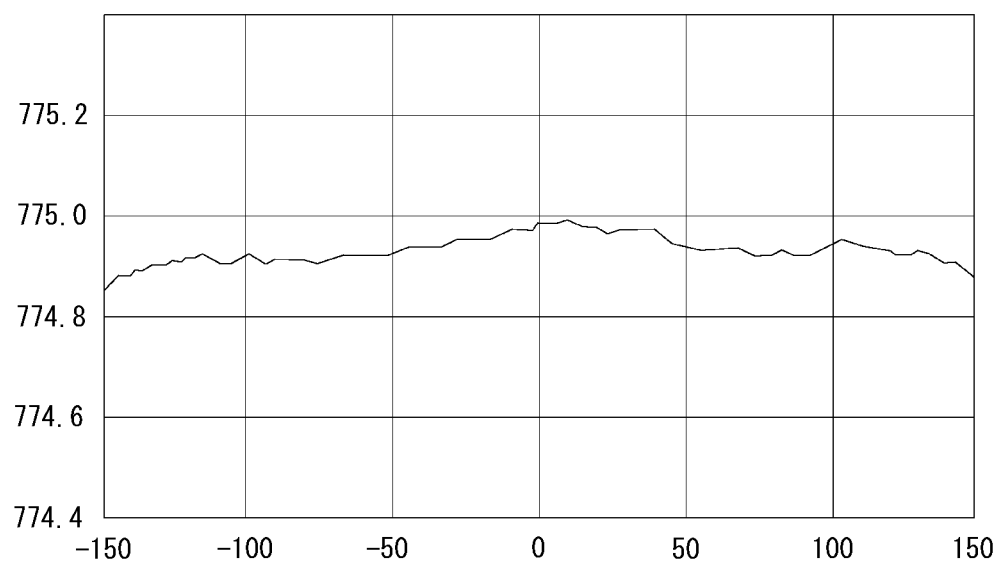
FIG. 7D is a diagram illustrating the thickness of a wafer having been polished in Experimental Example 4 in Table 1.

FIG. 7A to FIG. 7D illustrate the wafer shapes in Experimental Examples 1 to 4 in order. In Experimental Example 1, a machining load of 1000 daN was used and the wafer shape after polishing was a concave shape as illustrated in FIG. 7A. By contrast, in Experimental Example 2, the machining load was lighter, the values of the sum of torques Ti+To and the ratio of torques Ti/To were smaller, thus the wafer shape after polishing was likely to be a deeper concave shape as illustrated in FIG. 7B. Further, in Experimental Examples 3 and 4, since the machining load was heavier, the values of the sum of torques Ti+To and the ratio of torques Ti/To were larger, thus the wafer shape after polishing was likely to be flat or a convex shape as illustrated in FIG. 7C and FIG. 7D.

Table 2 illustrates the lower plate rotation rate settings, the measured torques, and the results of polishing in experimental examples.

TABLE 2

|  | Rotation rate of lower plate (rpm) | Sun gear torque (Ti) | Internal gear torque (To) | Ti + To | Ti/To | GBIR change rate | ESFQR change rate |
|---|---|---|---|---|---|---|---|
| Experimental Example 5 | 25 | 12.98 | 12.39 | 25.37 | 1.05 | 1.72 | 1 |
| Experimental Example 6 | 22 | 16.72 | 12.35 | 29.07 | 1.35 | 1.18 | 1.33 |
| Experimental Example 7 | 19 | 19.81 | 11.57 | 31.38 | 1.71 | 1 | 1.24 |

Further, polishing conditions that were common to the experimental examples in Table 2 were as follows:
  Polishing pad: a polishing pad which was made of a polyurethane foam material, and had basic characteristics of for example a thickness of approximately 1 mm, a hardness (Shore A) of 80 to 88 (°), and a compressibility of 1.4 to 3.4 (0%);
  Polishing solution: a polishing solution having basic characteristics of for example an average abrasive grain particle size of 45 to 65 (nm), a specific gravity of 1.15 to 1.16, a PH value of 10.8 to 11.8;
  Type of carrier plate: a stainless-steel substrate coated with a DLC coating material;
  Machining load: 1000 daN;
  Upper plate rotation rate: −18.4 rpm (the minus sign indicates counterclockwise rotation);
  Sun gear rotation rate: 25 rpm; and
  Internal gear rotation rate: 4 rpm.

The shape of wafers having been polished can be measured using a conventional measuring instrument. For a measurement of GBIR, the measurement range was 298 mm, excluding an edge of 1 mm. For a measurement of ESFQR, the measurement range was 298 mm, excluding an edge of 1 mm (length: 35 mm, radian: 5°).

Figure 8A:
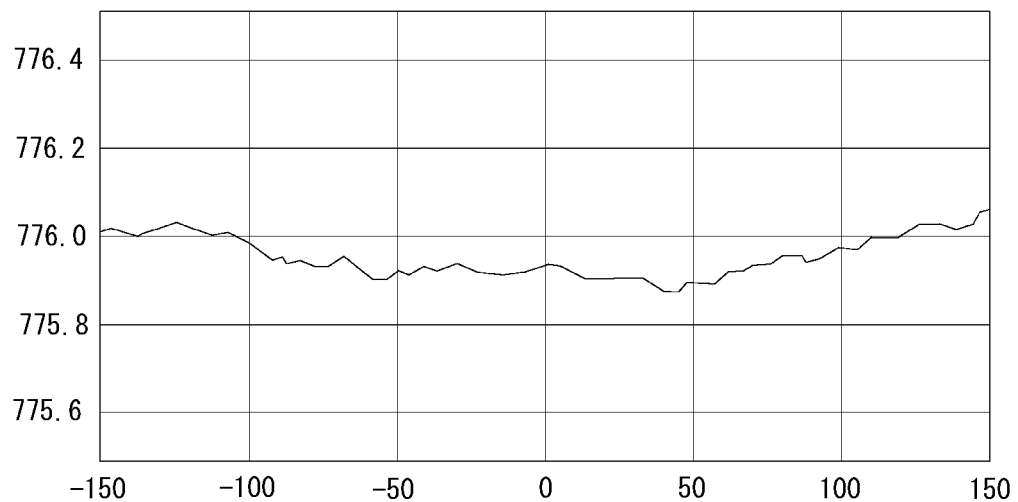
FIG. 8A is a diagram illustrating the thickness of a wafer having been polished in Experimental Example 5 in Table 2.
Figure 8B:
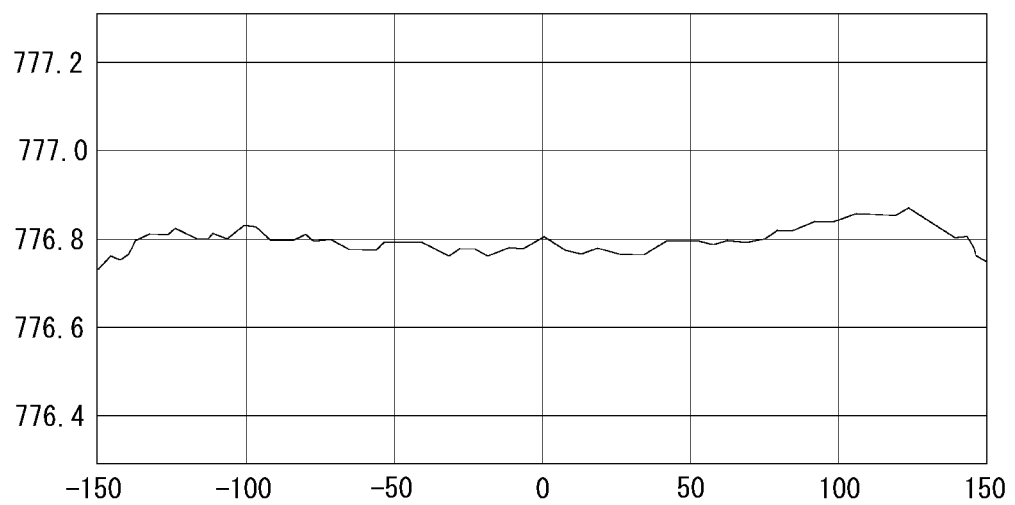
FIG. 8B is a diagram illustrating the thickness of a wafer having been polished in Experimental Example 6 in Table 2.
Figure 8C:
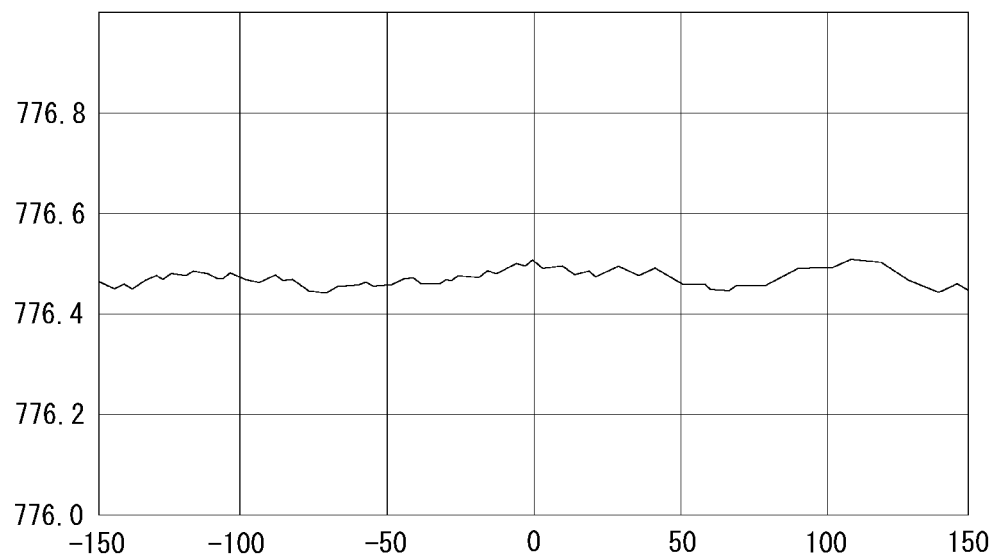
FIG. 8C is a diagram illustrating the thickness of a wafer having been polished in Experimental Example 7 in Table 2.

FIG. 8A to FIG. 8C illustrate the wafer shapes in Experimental Examples 5 to 7 in order. In Experimental Example 5, the lower plate rotation rate was set to 25 rpm, and the wafer shape after polishing was a concave shape as illustrated in FIG. 8A. By contrast, in Experimental Examples 6 and 7, since the lower plate rotation rate was lower, the values of the sum of torques Ti+To and the ratio of torques Ti/To were larger, thus the wafer shape after polishing was likely to be flat or a convex shape as illustrated in FIG. 8B and FIG. 8C.

A method and an apparatus for double-side polishing wafers, according to this disclosure have been specifically described above using embodiments; however, this disclosure is not limited to the embodiments and different variations are possible.

For example, in a variation, the condition setting unit 50 may further include a machine learning device. The machine learning device is capable of machine learning using a given existing algorithm. For example, the relationship of the sum of the torques (Ti+To) of the sun gear 20 and the internal gear 30 and the ratio of the torques (Ti/To) to the wafer shape can be learned using algorithms such as a neutral network. This allows the condition setting unit 50 to automatically set polishing conditions based on the sum of the torques (Ti+To) of the sun gear 20 and the internal gear 30 and the ratio of the torques (Ti/To), and thus the desired GBIR value and/or ESFQR value can be satisfied.

Further, in the polishing flowcharts of this disclosure, polishing for GBIR and polishing for ESFQR are performed in this order; however, this disclosure is not limited to this, and the order of polishing may be changed or only one of the polishing steps may be performed.

Moreover, the condition setting unit 50 may divide the polishing step for the wafers W into a plurality of sub-steps based on the measured shape of the wafers W. For example, the sub-steps may include a sub-step of reducing roughness in the circumferential direction of the wafer W and a sub-step of reducing roughness in the radial direction of the wafer W.

The condition setting unit 50 can also set the control ranges of the sum of torques Ti+To and the ratio of torques Ti/To in each of the plurality of sub-steps and can determine whether or not the values of the sum of torques Ti+To and the ratio of torques Ti/To are within the control ranges to determine whether or not the polishing conditions need to be changed.

REFERENCE SIGNS LIST

1: Double-side polishing apparatus;
2: Rotating plates;
11: Upper plate motor;
13: Lower plate motor;
14: Carrier plate;
15: Upper polishing pad;
16: Lower polishing pad;
17: Polishing solution;
20: Sun gear;
30: Internal gear;
21: Sun gear motor (first motor);
22: First torque sensing device;
31: Internal gear motor (second motor);
32: Second torque sensing device;
40: Computing unit;
50: Condition setting unit;
60: Storage unit;
70: Pressure device;
F: Machining load;
A1, A2, A3, A4: Rotation direction;
A5: Direction of revolution;

A6: Direction of rotation;
Fd, Fi, Fo, Fs: Force;
S01-S19: Step;
W: Wafer.

The invention claimed is:

1. A method of double-side polishing a work, by which a work is polished in a carrier plate rotated by a sun gear and an internal gear, the method comprising:
setting a polishing condition depending on a target shape of the work to be obtained by polishing;
starting polishing based on the polishing condition;
measuring a torque of the sun gear (Ti) and a torque of the internal gear (To);
calculating a value of a sum of the torques (Ti+To) of the measured torque of the sun gear (Ti) and the measured torque of the internal gear (To) and a value of a ratio of the torques (Ti/To) using a computer;
setting control ranges of the sum of the torques (Ti+To) and the ratio of the torques (Ti/To) using a processor, in communication with the computer; and
determining whether or not the polishing condition need to be changed based on whether or not the value of the sum of the torques (Ti+To) and the value of the ratio of the torques (Ti/To) are within the control ranges using the processor, wherein
the carrier plate is placed between an upper plate and a lower plate of rotating plates,
in a state in which either the value of the sum of the torques (Ti+To) or the value of the ratio of the torques (Ti/To) are outside of the control range, adjusting a rotation rate of the lower plate or a machining load applied by a pressure device, and
in a state in which both the value of the sum of the torques (Ti+To) and the value of the ratio of the torques (Ti/To) are within the control range, continue polishing to the predetermined polishing condition.

2. The method of double-side polishing a work, according to claim 1, further comprising, before starting double-side polishing, a step of previously acquiring a relationship of the sum of the torques (Ti+To) and the ratio of the torques (Ti/To) to the target shape of the work to be obtained by polishing,
wherein the setting the control ranges of the sum of the torques (Ti+To) and the ratio of the torques (Ti/To) is performed based on the acquired relationship.

3. The method of double-side polishing a work, according to claim 2, wherein the target shape of the work to be obtained by polishing is determined using one or both of a GBIR value and an ESFQR value.

4. The method of double-side polishing a work, according to claim 3,
wherein using the computer, the value of the torque of the sun gear (Ti) and the value of the torque of the internal gear (To) are converted to ratio values of an operating output of a motor driving the sun gear and an operating output of a motor driving the internal gear with respect to respective rated outputs,
in determining the target shape of the work to be obtained by polishing using the GBIR value, the processor sets the control range of the sum of the torques (Ti+To) to 30 to 35, and the control range of the ratio of the torque (Ti/To) to 1.5 to 2.1, and
the values of the ratios of the operating outputs of the motors to the rated outputs are calculated by a formula:

(value of output of the motor in operation/value of the rated output of the motor)×100.

5. The method of double-side polishing a work, according to claim 3
wherein using the computer, the value of the torque of the sun gear (Ti) and the value of the torque of the internal gear (To) are converted to ratio values of an operating output of a motor driving the sun gear and an operating output of a motor driving the internal gear with respect to respective rated outputs, and
in determining the target shape of the work to be obtained by polishing using the ESFQR value, the processor sets the control range of the sum of the torques (Ti+To) to 25 to 30, and the control range of the ratio of the torque (Ti/To) to 1.4 to 1.9, and
the values of the ratios of the operating outputs of the motors to the rated outputs are calculated by a formula:

(value of output of the motor in operation/value of the rated output of the motor)×100.

6. The method of double-side polishing a work, according to claim 1, further comprising:
measuring a shape of the work using a sensor before polishing; and
dividing a double-side polishing the work based on the measured shape of the work into a plurality of sub-steps using the computer,
wherein the setting control ranges of the sum of the torques (Ti+To) and the ratio of the torques (Ti/To) is performed in each of the sub-steps, and
determining whether or not the polishing condition need to be changed based on whether or not the value of the sum of the torques (Ti+To) and the value of the ratio of the torques (Ti/To) are within the control ranges is performed in each of the sub-steps.

7. The method of double-side polishing a work, according to claim 6 wherein the plurality of sub-steps comprise:
a sub-step of reducing roughness in a circumferential direction of the work; and
a sub-step of reducing roughness in a radial direction of the work.

8. A method of producing a work using the method of double-side polishing a work, according to claim 1.

9. A double-side polishing apparatus for a work, comprising:
rotating plates including an upper plate and a lower plate that are rotatable;
a sun gear placed at a center portion of the rotating plates;
an internal gear placed around a periphery of the rotating plates;
a carrier plate that is placed on the lower plate and is configured such that a work can be placed on the carrier plate and the carrier plate is rotated between the upper plate and the lower plate by the sun gear and the internal gear;
a first torque sensing device, including at least a sensor, that measures a torque (Ti) of the sun gear during double-side polishing;
a second torque sensing device, including at least a separate sensor, that measures a torque (To) of the internal gear during double-side polishing;
a computer that receives information of the measured torques and calculates a value of a sum of the torques (Ti+To): the torque of the sun gear (Ti) and the torque of the internal gear (To), and a value of a ratio of the torques (Ti/To) based on the torque information; and
a processor configured to set a target shape of the work to be obtained by polishing and a polishing condition, and receive the value of the sum of the torques (Ti+To) and the value of the ratio of the torques (Ti/To) from the computer, wherein the processor determines whether the polishing condition need to be changed based on whether or not the value of the sum of the torques (Ti+To) and the value of the ratio of the torques (Ti/To) are within control ranges, wherein, in a state in which either the value of the sum of the torques (Ti+To) or the value of the ratio of the torques (Ti/To) are outside of the control range, the processor is configured to adjust a rotation rate of the lower plate or a machining load applied by a pressure device, and wherein, in a state in which both the value of the sum of the torques (Ti+To) and the value of the ratio of the torques (Ti/To) are within the control range, the processor is configured to continue polishing to the predetermined polishing condition.

10. The double-side polishing apparatus for a work, according to claim 9, wherein the double-side polishing apparatus further comprises a memory previously storing a relationship of the sum of the torques (Ti+To) and the ratio of the torques (Ti/To) to the target shape of the work, and/or the processor is configured to receive the relationship, and before double-side polishing the processor either acquires the relationship from the memory or acquires the relationship externally, and sets control ranges of the sum of the torques (Ti+To) and the ratio of the torques (Ti/To) based on the acquired relationship.

11. The double-side polishing apparatus for a work, according to claim 9, wherein the processor determines a target shape of the work to be obtained by polishing using one or both of a GBIR value and an ESFQR value.

12. The double-side polishing apparatus for a work, according to claim 11, wherein the computer is further configured to convert the value of the torque of the sun gear (Ti) and the value of the torque of the internal gear (To) to ratio values of an operating output of a motor driving the sun gear and an operating output of a motor driving the internal gear with respect to respective rated outputs, in determining the target shape of the work to be obtained by polishing using the GBIR value, the processor sets the control range of the sum of the torques (Ti+To) to 30 to 35, and the control range of the ratio of the torque (Ti/To) to 1.5 to 2.1, and the values of the ratios of the operating outputs of the motors to the rated outputs are calculated by a formula:

(value of output of the motor in operation/value of the rated output of the motor)×100.

13. The double-side polishing apparatus for a work, according to claim 11, wherein the computer is further configured to convert the value of the torque of the sun gear (Ti) and the value of the torque of the internal gear (To) are converted to ratio values of an operating output of a motor driving the sun gear and an operating output of a motor driving the internal gear with respect to respective rated outputs, in determining the target shape of the work to be obtained by polishing using the ESFQR value, the processor sets the control range of the sum of the torques (Ti+To) to 25 to 30, and the control range of the ratio of the torque (Ti/To) to 1.4 to 1.9, and the values of the ratios of the operating outputs of the motors to the rated outputs are calculated by a formula:

(value of output of the motor in operation/value of the rated output of the motor)×100.

14. The double-side polishing apparatus for a work, according to claim 11, wherein the processor further sets a polishing condition by using a neural network such that one or both of a desired GBIR value and a desired ESFQR value is satisfied based on the sum of the torques (Ti+To) and the ratio of the torques (Ti/To).

15. The double-side polishing apparatus for a work, according to claim 9, further comprising a first motor connected to the sun gear and a second motor connected to the internal gear, wherein the first torque sensing device that measures the torque of the first motor rotating the sun gear as the torque (Ti) of the sun gear, and the second torque sensing device measures the torque of the second motor rotating the internal gear as the torque (To) of the internal gear.

16. The double-side polishing apparatus for a work, according to claim 9, further comprising a lower plate motor connected to the lower plate, wherein the processor is configured to control the rotation rate of the lower plate using the lower plate motor, the rotating plates vertically apply a machining load to the work, and the processor is configured to control the machining load.

* * * * *